(12) United States Patent
Lin et al.

(10) Patent No.: US 10,901,021 B2
(45) Date of Patent: Jan. 26, 2021

(54) METHOD FOR DETECTING WAFER PROCESSING PARAMETERS WITH MICRO RESONATOR ARRAY SENSORS

(71) Applicant: APPLIED MATERIALS, INC., Santa Clara, CA (US)

(72) Inventors: Chuang-Chia Lin, San Ramon, CA (US); Upendra Ummethala, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 21 days.

(21) Appl. No.: 16/283,369

(22) Filed: Feb. 22, 2019

(65) Prior Publication Data

US 2019/0265287 A1    Aug. 29, 2019

Related U.S. Application Data

(60) Provisional application No. 62/636,071, filed on Feb. 27, 2018.

(51) Int. Cl.
| | | |
|---|---|---|
| *G01R 29/08* | (2006.01) | |
| *H01L 21/66* | (2006.01) | |
| *H01Q 1/38* | (2006.01) | |

(52) U.S. Cl.
CPC ..... *G01R 29/0878* (2013.01); *G01R 29/0892* (2013.01); *H01L 22/12* (2013.01); *H01L 22/14* (2013.01); *H01L 22/34* (2013.01); *H01Q 1/38* (2013.01)

(58) Field of Classification Search
CPC .. G01R 29/0878; G01R 29/0892; H01L 22/12

USPC .......................................... 324/635
See application file for complete search history.

(56) References Cited

U.S. PATENT DOCUMENTS

| 6,621,134 | B1 * | 9/2003 | Zurn ................... | B81C 1/00246 |
| | | | | 257/415 |
| 8,106,723 | B2 * | 1/2012 | Watanabe .......... | H03H 9/02409 |
| | | | | 331/116 M |
| 9,911,664 | B2 * | 3/2018 | Lu ....................... | H01L 21/3212 |
| 2009/0239313 | A1 | 9/2009 | Anemikos et al. | |
| 2012/0245724 | A1 | 9/2012 | Erturk et al. | |
| 2012/0326701 | A1 | 12/2012 | Chen et al. | |

(Continued)

FOREIGN PATENT DOCUMENTS

WO    WO 03/069776    8/2003

OTHER PUBLICATIONS

International Search Report and Written Opinion from PCT/US2019/019459 dated Jun. 13, 2019, 9 pgs.

(Continued)

*Primary Examiner* — Reena Aurora
(74) *Attorney, Agent, or Firm* — Schwabe, Williamson & Wyatt, P.C.

(57) ABSTRACT

Embodiments include systems and methods for determining a processing parameter of a processing operation. Some embodiments include a diagnostic substrate that comprises a substrate, a circuit layer over the substrate, a capping layer over the circuit layer, and a sensing region across the capping layer. In an embodiment, the sensing region comprises, an array of first micro resonators and a second micro resonator. In an embodiment, the array of first micro resonators surround the second micro resonator.

19 Claims, 10 Drawing Sheets

(56) References Cited

U.S. PATENT DOCUMENTS

| | | | |
|---|---|---|---|
| 2013/0257487 A1* | 10/2013 | Opris | H02J 4/00 327/108 |
| 2014/0110799 A1 | 4/2014 | Yoshizawa | |
| 2017/0221775 A1 | 8/2017 | Tedeschi et al. | |
| 2017/0263511 A1 | 9/2017 | Tedeschi | |

OTHER PUBLICATIONS

Official Letter from Taiwan Patent Application No. 108106723 dated Dec. 4, 2019, 4 pgs.
International Preliminary Report on Patentability from PCT/US2019/019459 dated Sep. 3. 2020, 6 pgs.

* cited by examiner

METHOD FOR DETECTING WAFER PROCESSING PARAMETERS WITH MICRO RESONATOR ARRAY SENSORS

CROSS-REFERENCE TO RELATED APPLICATIONS

This application claims the benefit of U.S. Provisional Application No. 62/636,071, filed on Feb. 27, 2018, the entire contents of which are hereby incorporated by reference herein.

BACKGROUND

1) Field

Embodiments relate to the field of semiconductor manufacturing and, in particular, to systems and methods for monitoring processing parameters of semiconductor fabrication operations. Embodiments include arrays of micro resonators that are monitored for changes in resonance frequency at various resonance modes.

2) Description of Related Art

The scale of critical dimension (CD) and other feature sizes in many semiconductor devices is continually shrinking. Extensive process development is needed in order to develop reliable processes with high repeatability. Typically, a process is developed by running the process on test substrates. The test substrates are then analyzed with various metrology tools in order to determine the results of the process. For example, cross-sections of the substrate may be analyzed to determine the amount of material removed with an etching process or material added with a deposition process.

The use of such test substrates and post processing metrology has several drawbacks. One drawback is that the cross-sectioning and analysis takes significant time (e.g., days or longer). Additionally, the cross-sectioning requires significant work for each location. As such, only a limited number of cross-sections can be analyzed for each process. Another drawback is that only the end result of the process is able to be analyzed. This limits the information that may be obtained about the process. For example, the rate of change of a process is not determinable from the end result of cross-sections of the test substrate.

SUMMARY

Embodiments include systems and methods for determining a processing parameter of a processing operation. Some embodiments include a diagnostic substrate that comprises a substrate, a circuit layer over the substrate, a capping layer over the circuit layer, and a sensing region across the capping layer. In an embodiment, the sensing region comprises, an array of first micro resonators and a second micro resonator. In an embodiment, the array of first micro resonators surround the second micro resonator.

In an additional embodiment, a method for determining a processing parameter of a processing operation is disclosed. In an embodiment, the method comprises processing a diagnostic substrate comprising a micro resonator with the processing operation, driving the micro resonator to a plurality of resonance modes by applying a drive signal to the micro resonator, recording a resonant frequency of the micro resonator for each of the resonance modes, and determining the processing parameter from the resonant frequencies of the plurality of resonance modes.

In an additional embodiment, a method for determining a processing parameter of a processing operation is disclosed. In an embodiment, the method comprises processing a diagnostic substrate comprising a first micro resonator and a second micro resonator with the processing operation, and driving oscillation in the first micro resonator. In an embodiment, acoustic waves traveling across a surface of the diagnostic substrate induce oscillation of the second micro resonator. In an embodiment, the method further comprises comparing the oscillation of the first micro resonator to the oscillation of the second micro resonator, and determining the processing parameter of the processing operation from the difference between the oscillation of the first micro resonator and oscillation of the second micro resonator.

DETAILED DESCRIPTION

Figure 1A:
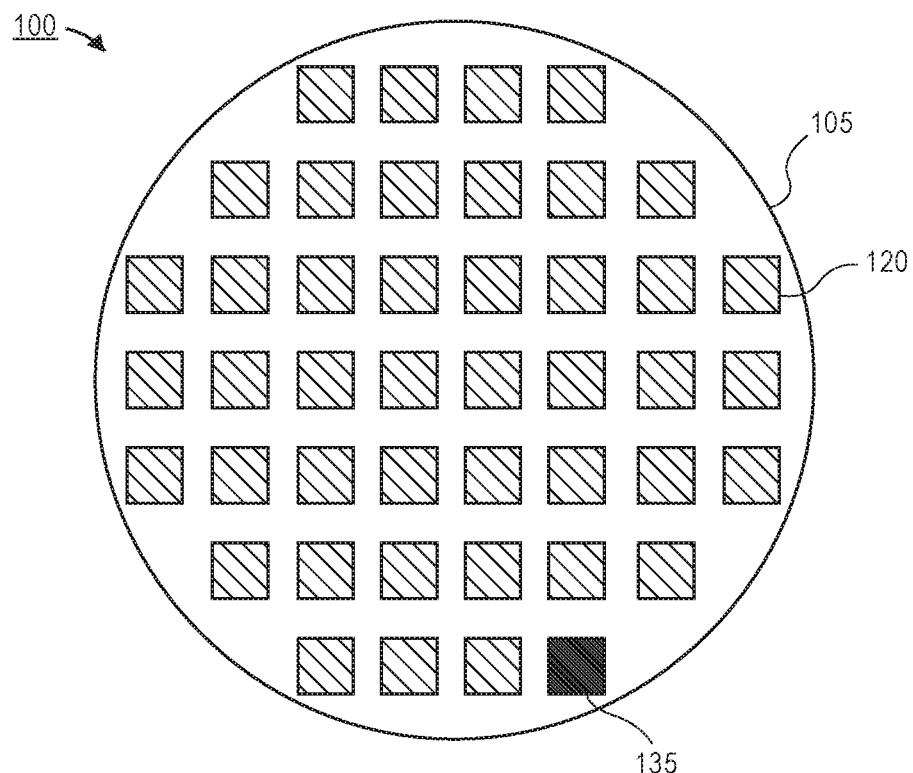
FIG. 1A is a schematic plan view of sensing regions on a substrate, in accordance with an embodiment.

Systems and methods described herein include diagnostic substrates for monitoring processing parameters of a processing operation. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, the current timeline for developing a processing operation, such as an etching process or a deposition process, is long due to the labor intensive metrology needed to determine processing parameters. Embodiments described herein accelerate the process development by using diagnostic substrates. Diagnostic substrates described herein include a plurality of micro resonator sensors distributed across the substrate. Accordingly, process parameters and their degree of uniformity across the substrate surface may be obtained without requiring many cross-sections.

In some embodiments the plurality of micro resonator sensors may be grouped into sensing regions across the substrate surface. For example, hundreds of sensing regions, each including thousands or tens of thousands of micro resonator sensors, may be formed on the diagnostic substrate. In such embodiments, the micro resonators in each sensing region may be used to provide a high signal to noise ratio. Accordingly, embodiments allow for high resolution even when dealing with critical dimensions (CD) at the tens of nanometer scale. In some embodiments, changes in CD in the range of angstroms to several nanometers with an accuracy in the parts per million (PPM) may be detected.

Furthermore, embodiments may include diagnostic substrates that may be utilized to provide in-situ monitoring of the processing operation. In-situ monitoring allows for monitoring processing parameters during the processing operation. As such, the rate of change of a processing parameter may be determined as well. Embodiments may include a wireless module that transmits information from the diagnostic substrate in real time. Alternatively, the information from the micro resonator sensors may be stored in a memory on the diagnostic substrate and processed subsequent to the processing operation.

In yet additional embodiments, arrays of micro resonators may be used to determine a processing parameter. Such embodiments may include the use of a first micro resonator (or an array of first micro resonators) that is coupled to a second micro resonator (or an array of second micro resonators). The first micro resonator may be driven to oscillation, and the oscillation induces acoustic waves across the surface of the diagnostic substrate. The acoustic waves drive oscillation of the second micro resonator. By comparing the oscillation of the first micro resonator to the oscillation of the second micro resonator, processing parameters (e.g., changes to the surface of the diagnostic substrate due to etching, deposition, polishing, implantation, and/or changes to temperature, surface potentials, pressure etc.) may be calculated. Such embodiments are particularly beneficial when an array of first micro resonators are used to induce oscillation in the second micro resonator. For example, the acoustic waves from each of the first micro resonators may constructively interfere and provide an improved signal to noise response in the oscillation of the second micro resonator.

Referring now to FIG. 1A, a schematic plan view illustration of a diagnostic substrate 100 is shown, in accordance with an embodiment. In an embodiment, the diagnostic substrate 100 may be formed on a substrate 105. The substrate 105 may be any suitable substrate on which sensing regions 120 may be fabricated. For example, the substrate 105 may be a semiconductor substrate, such as silicon, a silicon on insulator (SOI), a glass substrate, or the like. In an embodiment, the substrate 105 may be considered a wafer (e.g., a 300 mm silicon wafer or the like). The substrate 105 may be substantially the same dimensions as a production substrate used to fabricate functioning devices using a processing operation being developed with the diagnostic substrate 100. Furthermore, the diagnostic substrate 100 may comprise a surface that matches that of device substrates. For example, the exposed surface (i.e., across the entire substrate including the sensing regions 120) may comprise a single crystalline silicon (or other semiconductor) material. Such a pristine surface allows for low surface roughness, suitable for providing measurements of CD at the angstrom to nanometer scales. Furthermore, since the surface of the diagnostic substrate 100 matches that of device substrates on which functioning semiconductor devices are fabricated, accurate comparison to typical semiconductor processing operations may be provided.

Additionally, while referred to as a diagnostic substrate, it is to be appreciated that embodiments may also include sensing regions 120 on device substrates. In such embodiments, the sensing regions 120 may be used during the fabrication of functioning devices in order to provide metrology or other quality control measures concurrent with the device fabrication.

According to an embodiment, the diagnostic substrate 100 may include a plurality of sensing regions 120. The sensing regions 120 may be distributed across the surface of the substrate 105. Including sensing regions 120 at different locations allows the uniformity of a processing operation to be determined. It is to be appreciated that the sensing regions 120 illustrated in FIG. 1A are exemplary in nature. The sensing regions 120 may be of any number and in any distribution over the surface of the substrate 105. In some embodiments, there may be more than one hundred sensing regions 120 distributed over the surface of the substrate 120.

Embodiments may also include one or more processing regions 135 on the diagnostic substrate 100. In an embodiment, the processing regions 135 may be communicatively coupled to the sensing regions (e.g., with conductive traces, vias or the like). In an embodiment, the processing regions 135 may include circuitry, logic modules, memory modules, signal processing modules, communication modules, or the like. The processing regions 135 may be used to drive electrodes (described in greater detail below) that will drive the resonance of flexible diaphragms in micro resonators in each sensing region 120. The processing regions 135 may record resonant frequencies of each micro resonator. The processing regions 135 may also determine a processing parameter from the resonant frequencies using methods described in greater detail below. In other embodiments, the determination of the processing parameters from the resonant frequencies may be implemented on a computing system external to the diagnostic substrate. For example, the raw (or processed) data from each micro resonator may be transmitted (e.g., with a wireless communication module) to an external device for further analysis. In an embodiment, the communication link may be implemented using RF (e.g., WiFi, Bluetooth, etc.), acoustic communications, inductive communication, or optical communication (e.g., fiber optics), or any other suitable communication protocol.

In some embodiments, the diagnostic substrate 100 may comprise only passive components. That is, the diagnostic substrate 100 may comprise micro resonators that are communicatively coupled to an external device with an antenna or the like. The micro resonators may be driven and sensed with the external device. For example, a wireless link for transmitting power and data between the external device and the micro resonators may be provided on the diagnostic substrate 100.

In the illustrated embodiment, the processing region 135 is illustrated as being formed on a top surface of the substrate 105. However, it is to be appreciated that the processing regions 135 may be embedded within the substrate 105 or formed on a backside surface of the substrate 105. In an embodiment, the processing region 135 may also include a power source. For example, the power source may be a battery, or the like. In other embodiments, the power source may be a wireless power source. For example, the power source may comprise conductive coils, antennas, or the like to enable inductive power coupling or an acoustic power coupling. In some embodiments, the wireless power source may also be configured to provide a data link. That is, frequencies of the micro resonators may be transmitted to an external device using wireless coupling (e.g., acoustic coupling, inductive coupling, etc.).

Figure 1B:
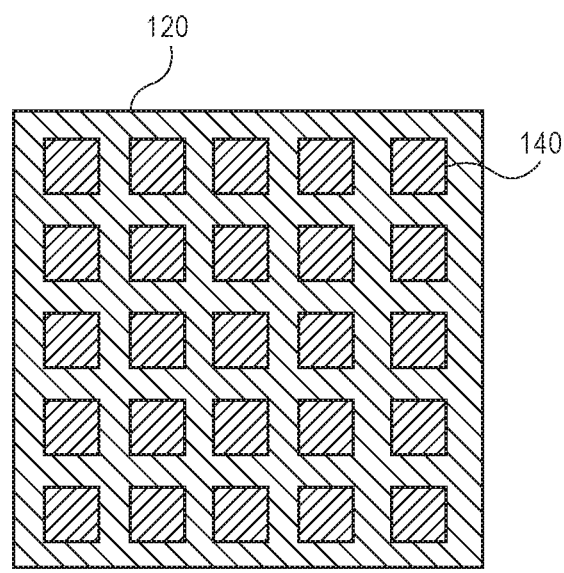
FIG. 1B is a zoomed in schematic plan view of a sensing region illustrating an array of micro resonator sensors, in accordance with an embodiment.

Referring now to FIG. 1B, a zoomed in schematic illustration of a sensing region 120 is shown, in accordance with an embodiment. Each sensing region 120 may include a plurality of micro resonator sensors 140. In the illustrated embodiment, twenty-five micro resonator sensors 140 are shown for simplicity. However, it is to be appreciated that thousands of micro resonator sensors 140 may be formed in each sensing region 120. For example, each of the micro resonator sensors 140 may have a surface area of approximately 50 $\mu m^2$. In such embodiments, forty thousand micro resonator sensors 140 may be formed in a sensing region of 100 $mm^2$. It is to be appreciated that the dimensions and number of micro resonator sensors 140 and the dimensions of the sensing regions 120 are exemplary in nature, and embodiments include micro resonators with dimensions greater than or less than 50 $\mu m^2$ and sensing regions with dimensions greater than or less than 100 $mm^2$.

The large number of micro resonator sensors 140 in each sensing region 120 allows for high signal to noise ratios through noise reduction. As such, small changes to the processing parameter being investigated may be determined. For example, changes of angstroms to several nanometers in the CD of an etched structure may be discernable, in accordance with embodiments described herein. Embodiments described herein may include micro resonator sensors that have resonance frequencies of tens of MHz. In such resonators, trenches with a 1:1 trench:ridge ratio with a depth of 50 nm may induce a shift in the resonance frequency of approximately 1 to 2 MHz. Furthermore, small changes (e.g., angstroms to nanometers) to the width of the trench may induce a resonance change of approximately 10 Hz to 1,000 Hz. Similarly, variations in temperature, surface potential, and/or pressure also drive resonance changes. For example, a single degree of temperature change may produce change in resonance frequency between 10 Hz and 1,000 Hz, or a change of one volt in surface potential may result in a change of resonance frequency between 10 Hz and 1,000 Hz. Such frequency variations are easily detectible with modern electronics and enable PPM accuracy.

Figure 2A:
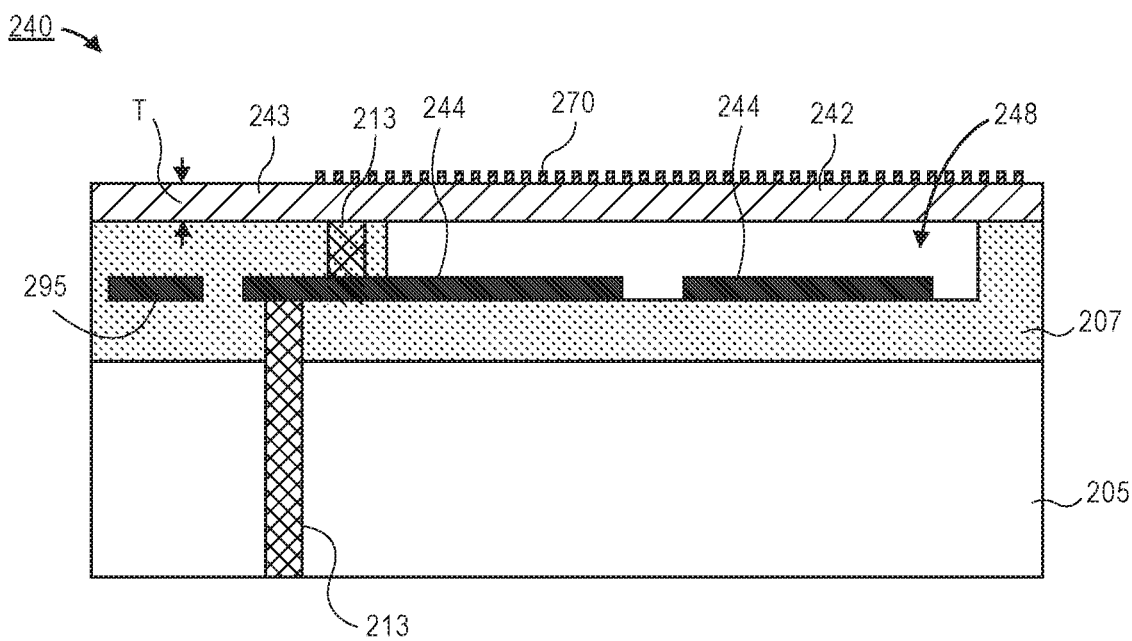
FIG. 2A is a cross-sectional illustration of a micro resonator with a diaphragm formed over a cavity, in accordance with an embodiment.

Referring now to FIG. 2A, a cross-sectional illustration of a micro resonator sensor 240 is shown, in accordance with an embodiment. The micro resonator sensor 240 may be formed over and into a circuit layer 207 formed over the substrate 205. In an embodiment, the circuit layer 207 may comprise layers of insulating and conductive materials (e.g., traces, vias, etc.). While referred to herein as a "circuit layer" 207, it is to be appreciated that the circuit layer 207 may comprise only passive components in some embodiments. In other embodiments, the circuit layer 207 may include active components as well. In an embodiment, the micro resonator sensor 240 includes a capping layer 243 over the circuit layer 207. In some embodiments, the capping layer 243 may be a pristine semiconductor layer. For example, the capping layer 243 may be silicon. In an embodiment, the capping layer 243 may have a thickness T. For example, the thickness T may be between 1 micron and 100 microns. In an embodiment, the capping layer 243 may comprise a diaphragm 242 that extends over a cavity 248 formed into the circuit layer 207. That is, the diaphragm 242 may be considered to be part of the capping layer 243, and does not extend up from the capping layer 243. It is to be appreciated that the thin film-diaphragm 242 is one example of a micro resonator sensor 240. Embodiments include any resonator system. For example, the micro resonator 240 may include cantilevered beams, or the like.

The diaphragm 242 may be driven to a resonant frequency by a plurality of electrodes 244 formed on a bottom surface of the cavity 248. In an embodiment, the plurality of electrodes 244 may be electrically coupled to the processing region 135 (not shown in FIG. 2) by electrical traces and vias 213. In an embodiment, a through substrate via 213 may be used to electrically coupled the electrodes 244 to a backside surface of the substrate 205. In an embodiment, the electrodes 244 may be electrically coupled to the capping layer 242 with one or more vias 213, traces, or the like. In an embodiment, the plurality of electrodes 244 may be drive/sense electrodes. As such, the electrodes 244 may be used to drive the diaphragm 242 and to detect the resonance frequencies of the diaphragm 242 during the processing of the diaphragm 242. In an embodiment, the plurality of electrodes 244 may use capacitance to drive the diaphragm 242. However, it is to be appreciated that the resonance of the micro resonator 240 may be obtained with any suitable mechanism. For example, the micro resonator 240 may be driven with magnetic drive systems, thermal systems, acoustic systems, optical systems, or the micro resonator 240 may include piezo electric materials that induce resonance.

In an embodiment, a patterning mask 270 may be formed over the diaphragm 242. The patterning mask 270 may be used to mask portions of the diaphragm 242 from a processing environment, such as an etching environment. During the processing operation that is being investigated with the diagnostic substrate 100, the pattern of the patterning mask 270 may be transferred into the diaphragm. As the diaphragm 242 is processed (e.g., etched), the resonance frequencies of the diaphragm 242 will change in predictable ways. The changes in resonance frequencies may then be used to calculate the physical changes in the diaphragm 242, as will be described in greater detail below.

In some embodiments, a passive coupling antenna 295 may be used to wirelessly drive and sense the resonance of the micro resonator sensor 240. For example, the antenna 295 may be formed in the circuit layer 207. The use of a passive coupling antenna 295 allows for the contactless communication of the resonance frequencies to an external device and/or for contactless power delivery. Additionally, in some embodiments no active devices are included in the diagnostic substrate 200 when a passive coupling antenna 295 is associated with each micro resonator sensor 240.

Figure 2B:
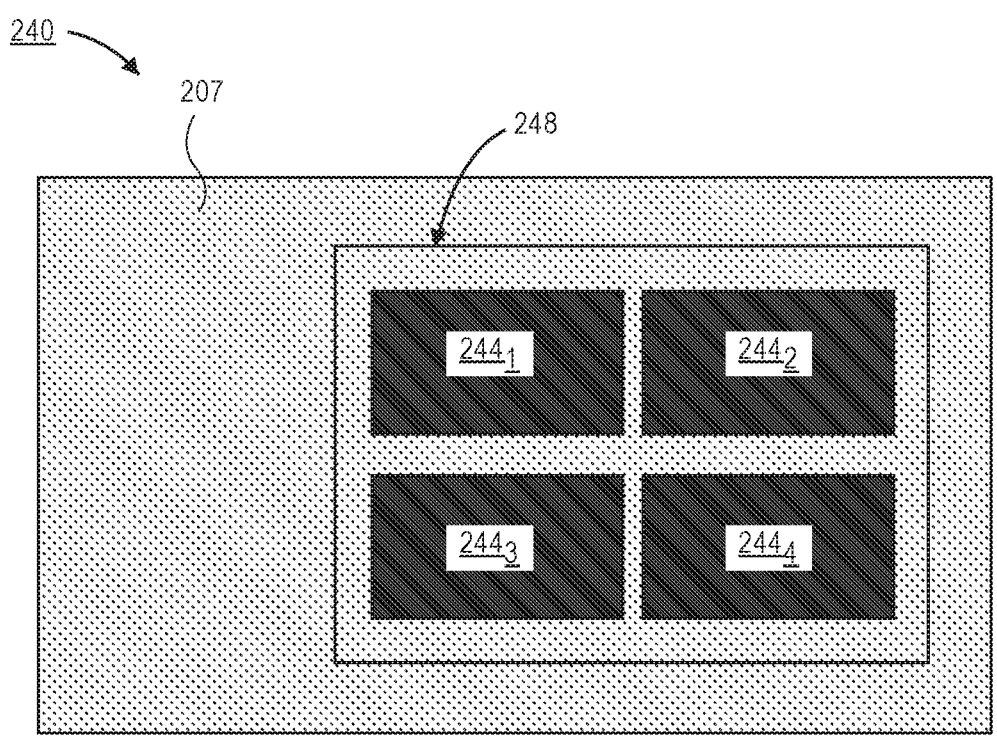
FIG. 2B is a plan view of a plurality of electrodes formed in the cavity of a micro resonator, in accordance with an embodiment.

Referring now to FIG. 2B, a plan view illustration of the cavity 248 in the circuit layer 207 is shown, in accordance with an embodiment. In the illustrated embodiment, the cavity 248 includes a rectangular shape. However, embodiments are not limited to such configurations, and the cavity 248 may be any desired shape, such as a square, circular, elliptical, or any other desired shape. As shown, the plurality of electrodes 244 are formed in the cavity 248. In embodiments, the number and arrangement of the electrodes 244 allows for different resonance modes to be induced in the diaphragm 242. The diaphragm 242 is not shown in FIG. 2B in order to not obscure the underlying features.

In the illustrated embodiment, four electrodes are shown. When four electrodes are included in the cavity 248, the diaphragm may be driven to at least three different resonance modes. A first resonance mode may be obtained by activating all four electrodes $244_1$-$244_4$ in unison. A second resonance mode may be obtained by alternating the activation of electrodes $244_1$ and $244_2$ with the activation of electrodes $244_3$ and $244_4$. A third resonance mode may be obtained by alternating the activation of electrodes $244_1$ and $244_3$ with the activation of electrodes $244_2$ and $244_4$. It is to be appreciated that additional resonance modes may be obtained by activating different combinations of electrodes 244.

Figure 2C:
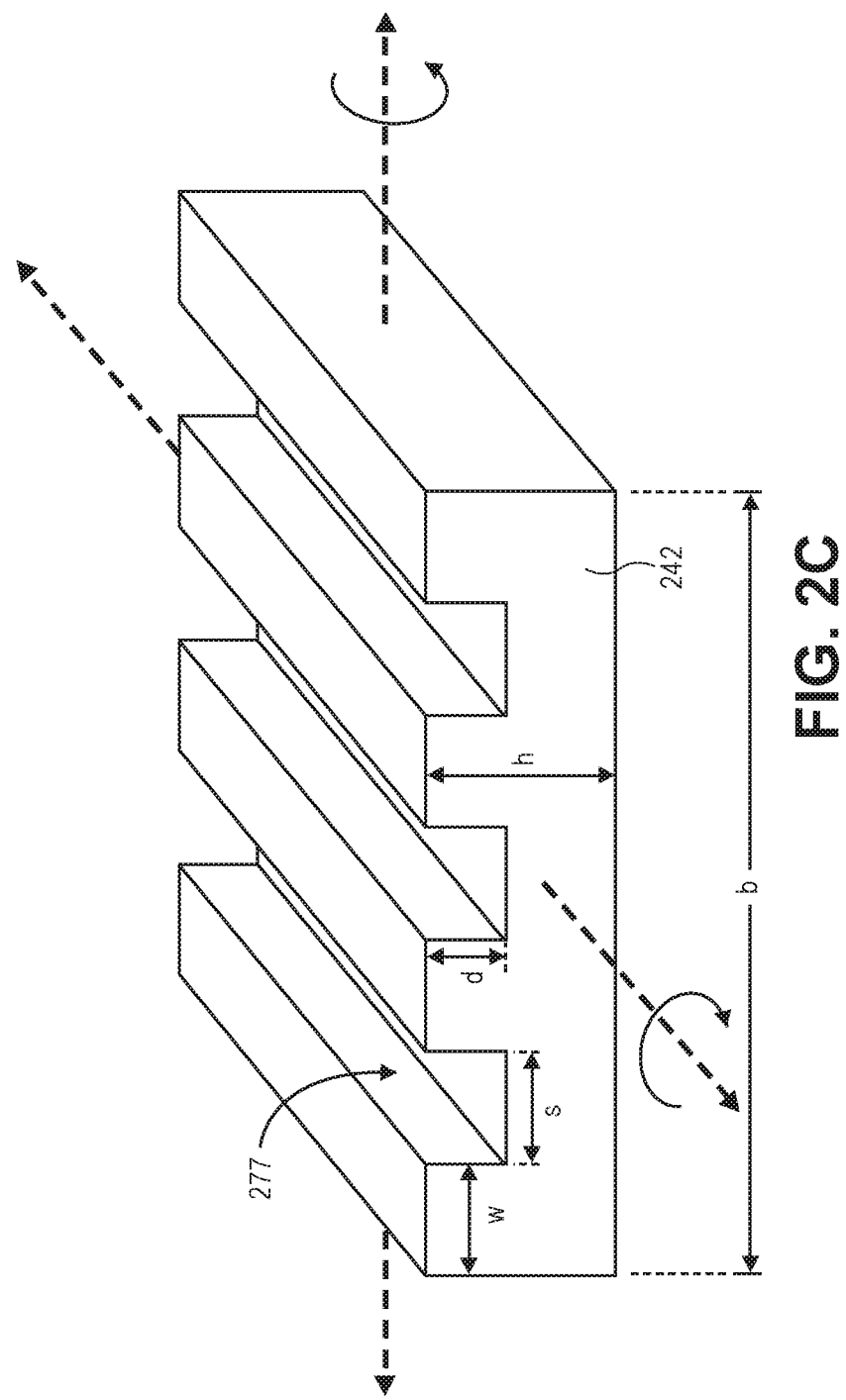
FIG. 2C is a perspective illustration of a pattern formed in the diaphragm of a micro resonator, in accordance with an embodiment.

Referring now to FIG. 2C, a perspective illustration of the diaphragm 242 is shown after being processed with a processing operation. The diaphragm 242 is shown in isolation in order to not obscure the figure. In an embodiment, the second resonant mode results in the diaphragm 242 bending about a line parallel to the direction of the trenches 277. In an embodiment, the third resonance mode results in the diaphragm 242 bending about a line perpendicular to the direction of the trenches 277. Initially, prior to etching the diaphragm that is substantially square, the resonant frequencies of the second and third resonance modes will be substantially uniform (since there are no trenches formed). After the trenches begin to be formed, the resonant frequencies of the second and third resonance modes begin to diverge. In a simplified lump model, the resonant frequency ω of the diaphragm is proportional to the moment of inertia I, as shown in Equation 1 where E is the modulus and m is the mass. Accordingly, as the moment of inertia I of each bending direction changes, so does the resonant frequency.

$$\omega \sim \sqrt{\frac{EI}{m}} \qquad \text{Equation 1}$$

The divergence of the resonant frequencies of the second and third resonance modes is the result of the moment of inertia about each bending direction changing in response to the changes in the topography of the diaphragm 242. Equations for calculating the moment of inertia about each bending direction can be modeled for expected topographies and even more accurate models may be numerically solved. For example, in a square diaphragm with a series of parallel trenches with a 1:1 trech:ridge ratio, the moment of inertia $I_{PARALLEL}$ is shown in Equation 2 and the moment of inertia $I_{PERPENDICULAR}$ is shown in Equation 3. It is to be appreciated that the equations disclosed herein are simplified lump models. Equations 1 and 2 do, however, illustrate magnitudes of various variables of the process. For example, the depth d in $I_{PERPENDICULAR}$ is cubed, whereas the d in the $I_{PARALLEL}$ is not raised to a higher power. Since the resonant frequencies for each mode are determined from the micro resonator sensor, the system of equations may then be solved to determine the missing parameters that provide the topography of the diaphragm 242.

$$I_{PARALLEL} = \frac{bh^3}{12} - \frac{bhd^2}{8} \qquad \text{Equation 2}$$

$$I_{PERPENDICULAR} = \frac{b(h-d)^3}{12} \qquad \text{Equation 3}$$

Figure 3A:
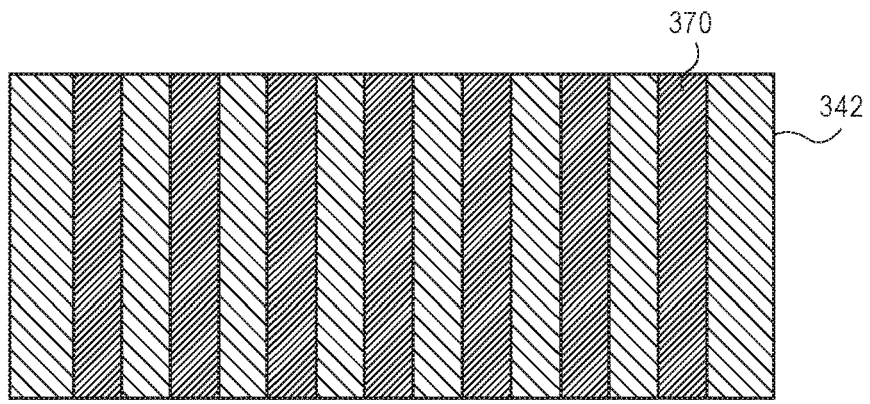
FIG. 3A is a plan view of a mask pattern formed over the diaphragm of the micro resonator, in accordance with an embodiment.
Figure 3B:
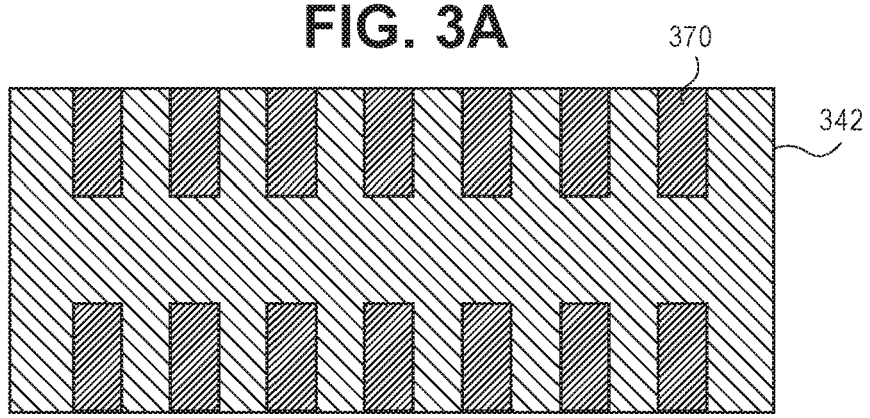
FIG. 3B is a plan view of a mask pattern formed over the diaphragm of the micro resonator, in accordance with an additional embodiment.
Figure 3C:
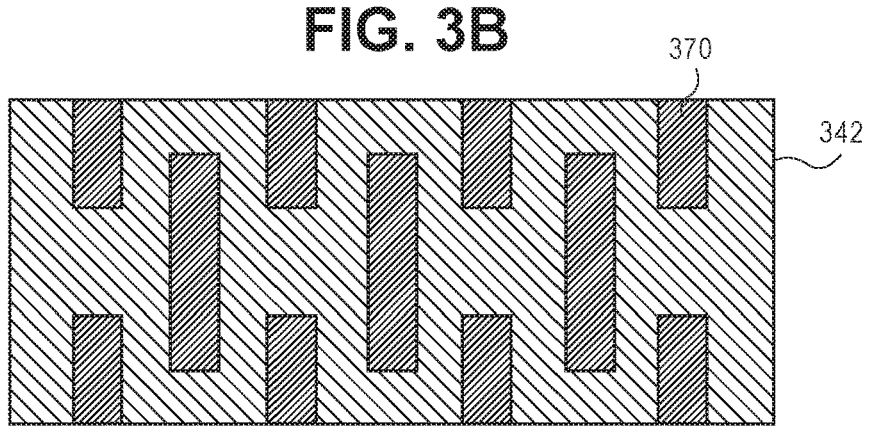
FIG. 3C is a plan view of a mask pattern formed over the diaphragm of the micro resonator, in accordance with an additional embodiment.
Figure 3D:
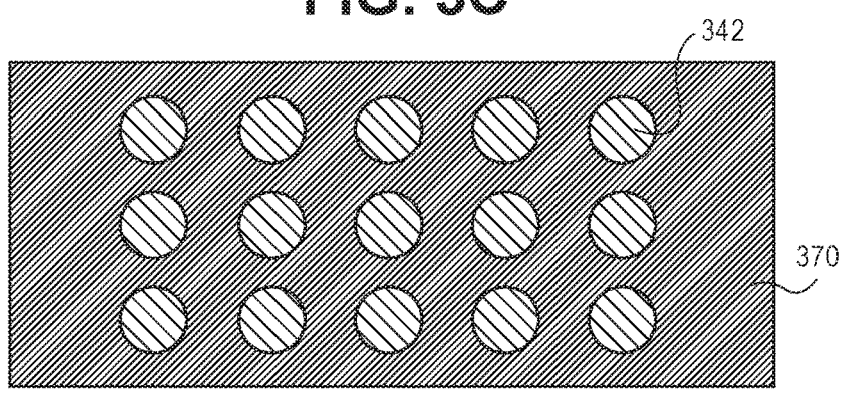
FIG. 3D is a plan view illustration of a mask pattern formed over the diaphragm of the micro resonator, in accordance with an additional embodiment.

While the scenario of parallel trenches is provided above, it is to be appreciated that embodiments may include any patterned topography. For example, FIGS. 3A-3D provide exemplary illustrations of different mask patterns 370 that may be transferred into the diaphragm 342. In FIG. 3A, a series of parallel trenches are shown. In FIG. 3B, a pattern 370 with discontinuous trenches is shown. Furthermore, FIG. 3C illustrates a pattern 370 for forming interdigitated trenches is shown. In FIG. 3D, a pattern 370 for forming a plurality of holes is shown. While FIGS. 3A-3D provide a few examples of mask patterns 370, it is to be appreciated that any pattern may be used in accordance with embodiments described herein. In order to use a pattern, embodiments only require that a model of moments of inertia for a plurality of resonance modes be generated. For example, the modeled moments of inertia may include computer generated models that are far more complex than the examples provided in Equations 1-3. Furthermore, as the complexity of the model is increased, and the number of resonance modes increased, finer details of the topography of the diaphragm may be obtained. For example, the taper of a trench may be determined, the presence of undercuts or footings may be determined, or the like.

Figure 4A:
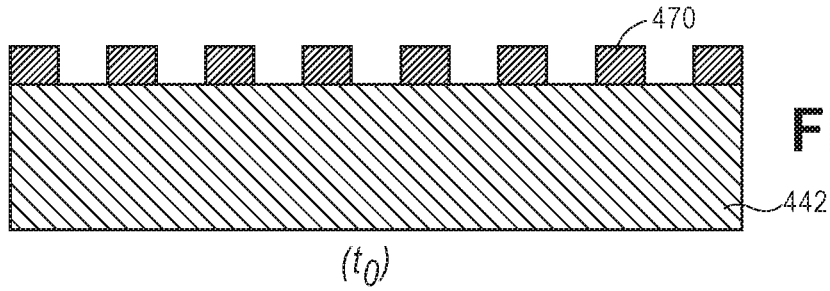
FIG. 4A is a cross-sectional illustration of a mask pattern formed over the diaphragm at a time $t_0$, in accordance with an embodiment
Figure 4B:
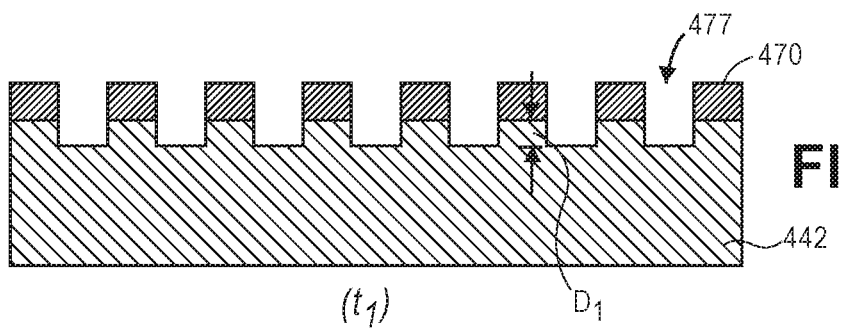
FIG. 4B is a cross-sectional illustration of the diaphragm at a time $t_1$, in accordance with an embodiment.
Figure 4C:
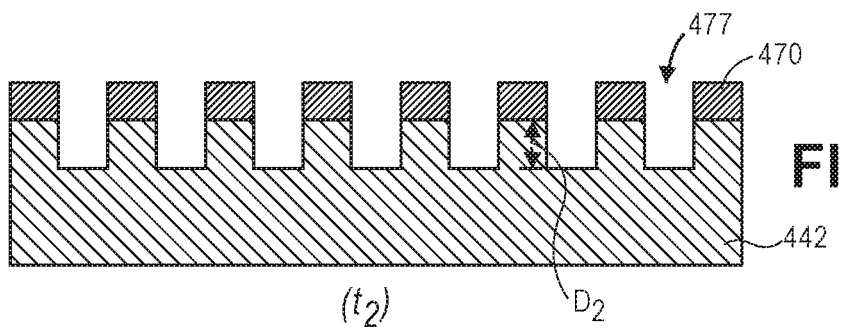
FIG. 4C is a cross-sectional illustration of the diaphragm at a time $t_2$, in accordance with an embodiment.
Figure 4D:
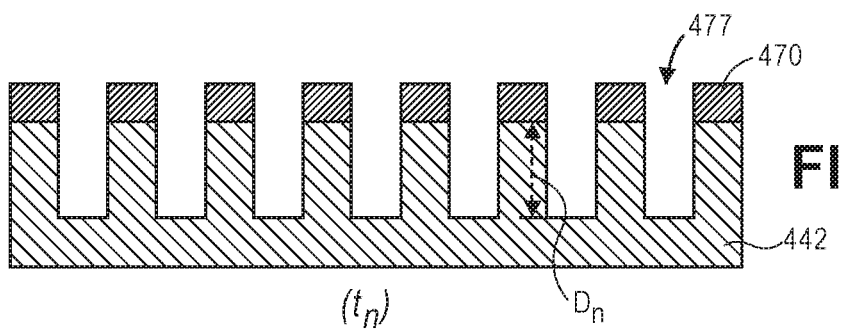
FIG. 4D is a cross-sectional illustration of the diaphragm at a time $t_n$, in accordance with an embodiment.
Figure 5:
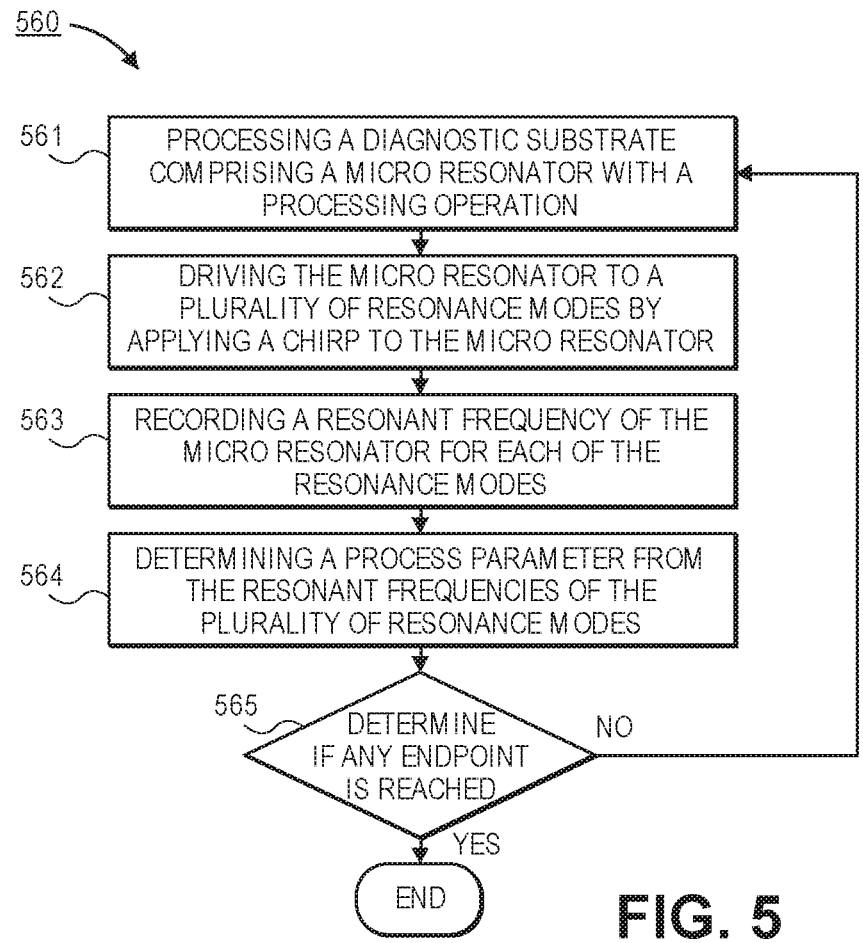
FIG. 5 is a process flow of a process for determining process parameters of a processing operation, in accordance with an embodiment.

Referring now to the cross-sectional illustrations in FIGS. 4A-4D and corresponding flow diagram in FIG. 5, a method for determining a process parameter of a processing operation is shown and described, in accordance with an embodiment.

FIG. 4A is a cross-sectional illustration of a diaphragm 442 with a mask pattern 470 formed over the surface, in accordance with an embodiment. The diaphragm 442 may be a portion of a micro resonator sensor in a diagnostic substrate, such as one described above. In the illustrated embodiment, the diaphragm 442 is shown at time $t_{(0)}$ prior to any processing.

Referring now to FIG. 5, the process 560 may begin with operation 561 which includes processing a diagnostic substrate comprising a resonator with a processing operation. In an embodiment, the resonator may be a diaphragm 442, such as the diaphragm 442 shown in FIG. 4A. The processed diaphragm 442 after a time $t_{(1)}$, is shown in FIG. 4B. In an embodiment, processing the diaphragm 442 may include any processing operation that is being investigated with the diagnostic substrate. For example, the processing operation may be an etching process, a deposition process, an implantation process, a chemical mechanical polishing (CMP) process, or any other process that alters the topography, mass, or other feature of the diaphragm 442. Additionally, the diaphragm 442 may be used to measure a temperature or surface potential during the processing operation.

Referring now to operation 562, process 560 may continue with driving the micro resonator to a plurality of resonance modes by applying a drive signal to the micro resonator. For example, the drive signal may comprise a chirp, a ping, or the like. As used herein, a "chirp" may refer to a signal with a variable frequency. The chirp therefore, supplies a plurality of different frequencies to the micro resonator. The resonant frequency induces a resonance response in the micro resonator, whereas the other frequencies are attenuated. In an embodiment, the diaphragm 442 may be driven to a plurality of resonance modes with electrodes in the micro resonator sensor. In a particular embodiment, the diaphragm 442 may be driven to a first resonance mode, a second resonance mode, and a third resonance mode.

Referring now to operation 563, process 560 may continue with recording the resonance frequency of each of the plurality of resonance modes. In an embodiment, the resonance frequencies of each of the resonance modes may be recorded in a memory that is local to the diagnostic substrate. In an additional embodiment, the resonance frequencies may be transmitted to an external memory, (e.g., with a wireless communication module on the diagnostic substrate).

Referring now to operation 564, process 560 may continue with determining a process parameter from the plurality of resonance frequencies. In an embodiment, the process parameter may include an etch depth, a width of a trench, a profile of a trench wall, a thickness of a deposited layer, or any other change in the diaphragm 442. The process parameter may be determined by using the plurality of resonance frequencies and models for the moments of inertia for each of the bending directions of the resonance modes, similar to the process described above with respect to FIG. 2C.

In some embodiments, process 560 may continue with adjusting a process recipe of the processing operation. For example, temperatures, pressures, gas flows, or the like may be changed in order to change the resulting process parameter in subsequent iterations of the process 560. The ability to change the processing recipe in situ allows for greater refinement of the processing operation and provides more information about the processing operation.

Referring now to operation 565 process 560 may continue with determining if an endpoint is reached. For example, the endpoint may be a desired time, a desired process parameter, or any other desired criteria. When the endpoint is not reached, the process may continue with repeating the processing operations 561-565 until the endpoint criteria is reached. For example, the process may repeat to determine the processing parameter after times $t_2$ to $t_0$ illustrated in FIGS. 4C-4D.

In some embodiments, after reaching the endpoint, the diagnostic substrate may be reused any desired number of times. For example, the diaphragms 442 may be resurfaced (e.g., with a planarizing process, an etching process, a deposition process, or the like) in order to rest the diagnostic substrate back to the initial starting condition. In other embodiments, the diagnostic substrate may be recalibrated and the diaphragms 442 may be reused without being resurfaced or otherwise reset. For example, diaphragms 442 may have a thick layer that is etched over a plurality of iterations of process 560 until the layer reaches an end of useable life status. At this point, the diaphragms 442 may be resurfaced in some embodiments.

As noted above, the ability to determine the processing parameters in-situ allow for the rates of change of the processing parameter to be determined. Accordingly, greater detail about the processing operation under investigation may be obtained in comparison to the information obtained by performing metrology after the processing operation is completed.

Furthermore, it is to be appreciated that the process 560 may be implemented with a plurality of micro resonator sensors formed over the surface of the diagnostic substrate. For example, tens of thousands of micro resonator sensors in each of a plurality of sensing regions of the diagnostic substrate may be used in parallel to obtain uniformity information of the processing operation. In such embodiments, operation 564 may further include finding an average value of the processing parameter in each sensing region. The large quantity of micro resonator sensors in each sensing region allow for high precision and resolution due to the favorable signal to noise ratio obtained by processing the information obtained from each micro resonator.

In other embodiments, differential comparisons of resonance frequency of pairs of micro resonator sensors may be implemented. For example, differential comparisons may be used to determine temperatures, surface potentials, and/or pressures of the capping surface. Such differential comparisons may be implemented by using a pair of micro resonator sensors where one of the pair is used as a control to isolate one or more variables. For example, in the case of a surface potential, a bias may be applied to a first micro resonator sensor and the second micro resonator sensor may be shorted (i.e., no bias is applied) to isolate the surface potential variable.

In yet another embodiment, the processing parameter may be determined with the use of a first micro resonator and a second micro resonator. The first micro resonator may be oscillated and acoustic waves may then travel across the diagnostic substrate from the first micro resonator to the second micro resonator. The acoustic waves then induce oscillation of the second micro resonator. Comparison of the oscillation of the second micro resonator to the oscillation of the first micro resonator provides a mechanism for determining the processing parameter.

Figure 6A:
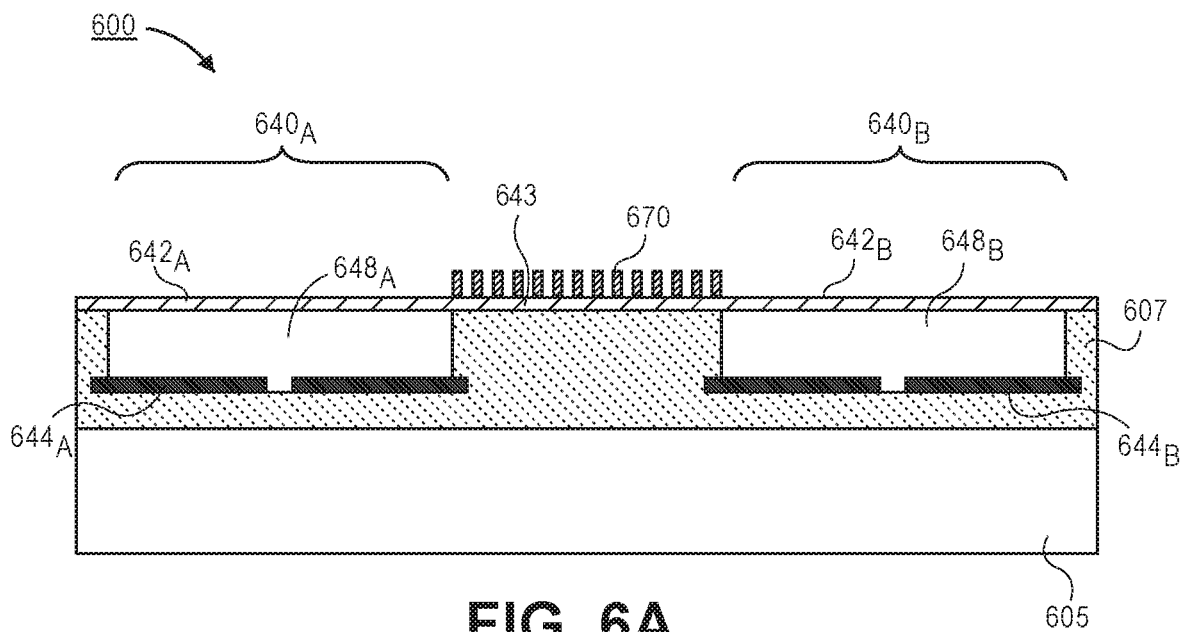
FIG. 6A is a cross-sectional illustration of a first micro resonator and a second micro resonator configured to be coupled to each other across a surface of the diagnostic substrate, in accordance with an embodiment.

Referring now to FIG. 6A, a cross-sectional illustration of a diagnostic substrate 600 with paired micro resonators 640$_A$ and 640$_B$ is shown, in accordance with an embodiment. In an embodiment, the diagnostic substrate 600 may comprise a substrate 605 and a circuit layer 607 over the substrate 600. In an embodiment, a capping layer 643 may be positioned over the circuit layer 607. In an embodiment, the first micro resonator 640$_A$ may be spaced apart from the second micro resonator 640$_B$ by a portion of the circuit layer 607 and the capping layer 643. The capping layer 643 may also form a diaphragm $642_A$ over a first cavity $648_A$ and a diaphragm $642_B$ over a second cavity $648_B$.

In an embodiment, a patterning mask 670 may be formed over the capping layer 643 between micro resonators $640_A$ and $640_B$. The patterning mask 670 may be used to mask portions of the capping layer 643 from a processing environment, such as an etching environment. During the processing operation that is being investigated with the diagnostic substrate 600, the pattern of the patterning mask 670 may be transferred into the capping layer 643. As the capping layer 643 is processed (e.g., etched), the coupling of oscillation from the first micro resonator $640_A$ to the second micro resonator $640_B$ will change in predictable ways. The differences (e.g., amplitude differences, phase differences, etc.) may then be used to calculate the physical changes in the layer 645.

Figure 6B:
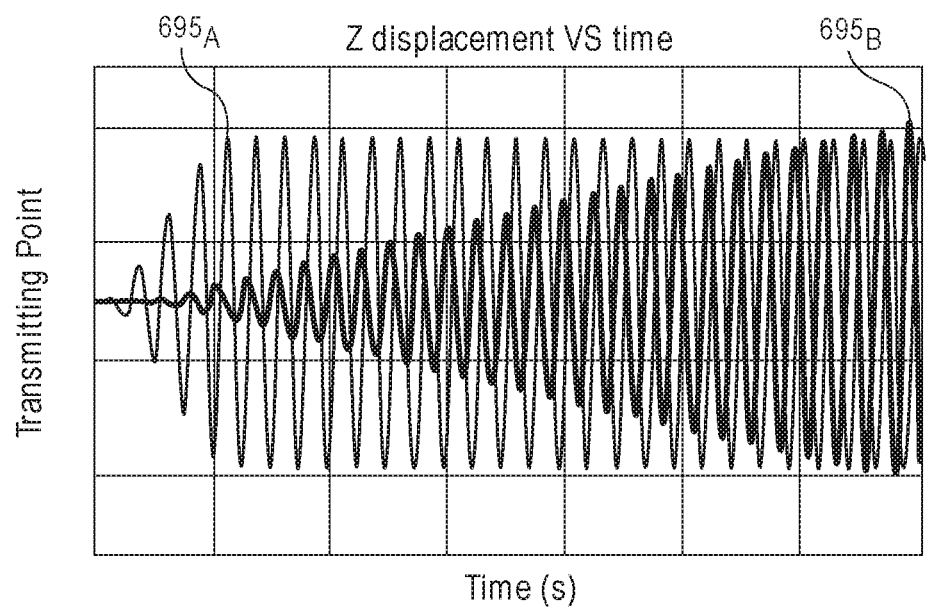
FIG. 6B is a graph of the oscillation amplitude of the first micro resonator and the second micro resonator with respect to time, in accordance with an embodiment.

Referring now to FIG. 6B, a graph of the Z-displacement of the diaphragms with respect to time is shown. The line $695_A$ represents the Z-displacement of the first micro resonator $640_A$ and the line $695_B$ represents the Z-displacement of the second micro resonator $640_B$. As shown, the oscillation $695_A$ of the first micro resonator $640_A$ is quickly saturated. The oscillation $695_B$ of the second micro resonator $640_B$ starts low and begins to increase with respect to time in response to the oscillation $695_A$. Once both oscillations $695_A$ and $695_B$ are saturated (i.e., in a steady state condition), the differences in the oscillation $695_A$ and $695_B$ may be analyzed. In one embodiment, the phase offset between the oscillation $695_A$ and $695_B$ may be used to determine an impedance across the layer 645. The impedance value may then be used to determine the processing parameter of interest (e.g., a physical change in the layer 645 resulting from the processing).

Figure 7A:
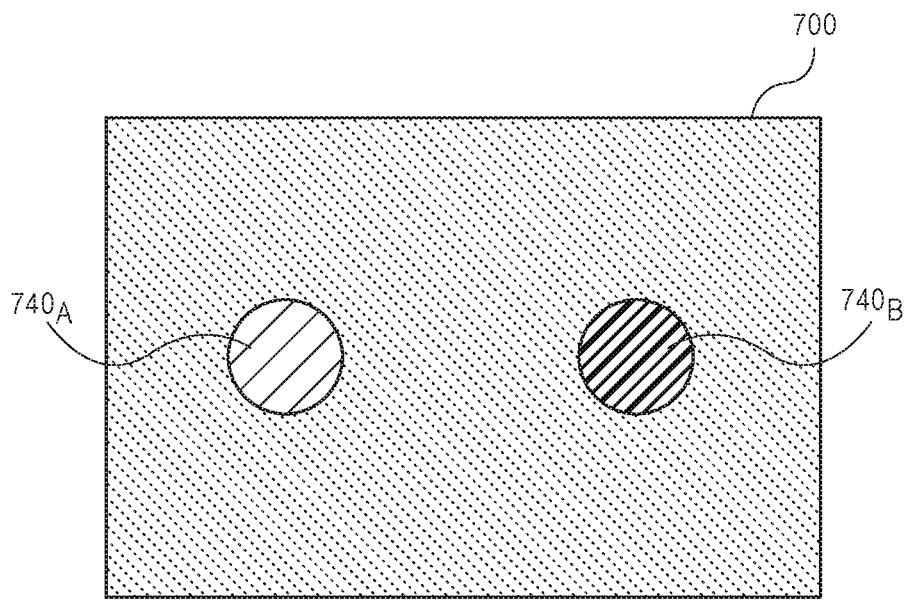
FIG. 7A is a plan view illustration of a pair of coupled micro resonators, in accordance with an embodiment.
Figure 7B:
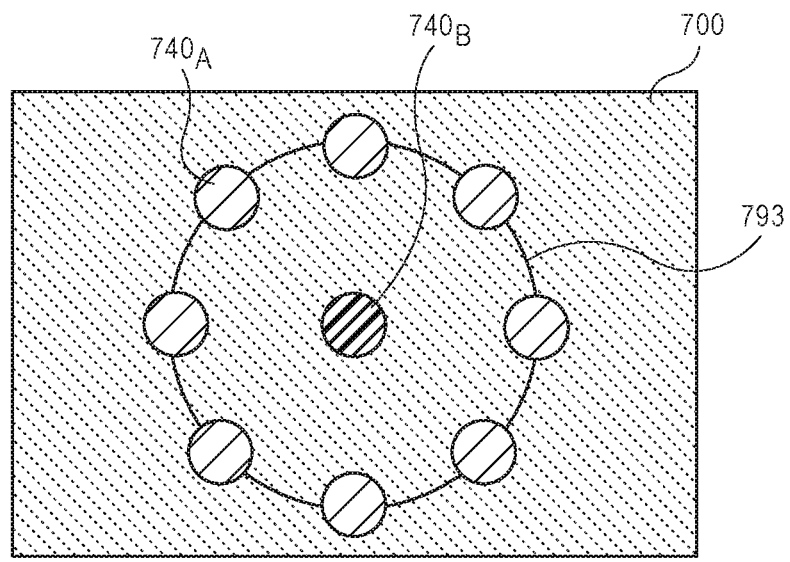
FIG. 7B is a plan view illustration of an array of first micro resonators surrounding a second micro resonator, in accordance with an embodiment.
Figure 7C:
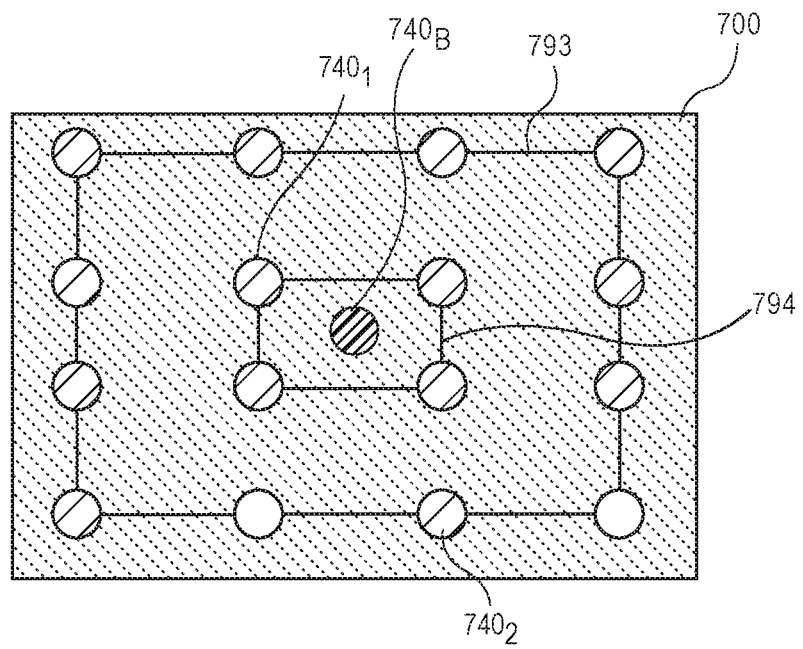
FIG. 7C is a plan view illustration of an array of two rows of first micro resonators surrounding a second micro resonator, in accordance with an embodiment.

Referring now to FIGS. 7A-7C, plan view illustrations of various arrays of first micro resonators $740_A$ and second micro resonators $740_B$ are shown, in accordance with different embodiments. The use of different array configurations allows for the improvement of the signal to noise ratios compared to a 1:1 pairing. Particularly, a plurality of first micro resonators $740_A$ may be operated in unison (or using a time delay) to drive a single second micro resonator $740_B$. As such constructive interference from the first micro resonators $740_A$ will boost the signal strength from the second micro resonator $740_B$. In FIGS. 7A-7C, the micro resonators are simplified as circular areas in order to make clear the operation and spacing of the various array configurations. However, it is to be appreciated that the micro resonators 740 in FIG. 7A-7C may be any suitable micro resonator described herein.

Referring now to FIG. 7A, a plan view illustration of diagnostic substrate 700 with a 1:1 pairing of a first micro resonator $740_A$ to a second micro resonator $740_B$ is shown, in accordance with an embodiment. The diagnostic substrate 700 may be substantially similar to the diagnostic substrate 600 illustrated in FIG. 6A.

Referring now to FIG. 7B, a plan view illustration of a diagnostic substrate 700 with a plurality of first micro resonators $740_A$ surrounding a second micro resonator $740_B$ is shown, in accordance with an embodiment. As shown, each of the first micro resonators $740_A$ may be electrically coupled to each other by traces 793. Electrically coupling the first micro resonators $740_A$ together may allow for the plurality of first micro resonators $740_A$ to operate in unison. In order to provide constructive interference, the first micro resonators $740_A$ may each be a uniform distance from the second micro resonator $740_B$. For example, the first micro resonators $740_A$ may be arranged in a circle around the second micro resonator $740_B$. In the illustrated embodiment, six first micro resonators $740_A$ are shown. However, it is to be appreciated that any number of first micro resonators $740_A$ may be used in accordance with various embodiments (e.g., tens or hundreds of first micro resonators $740_A$ may be used).

Figure 8:
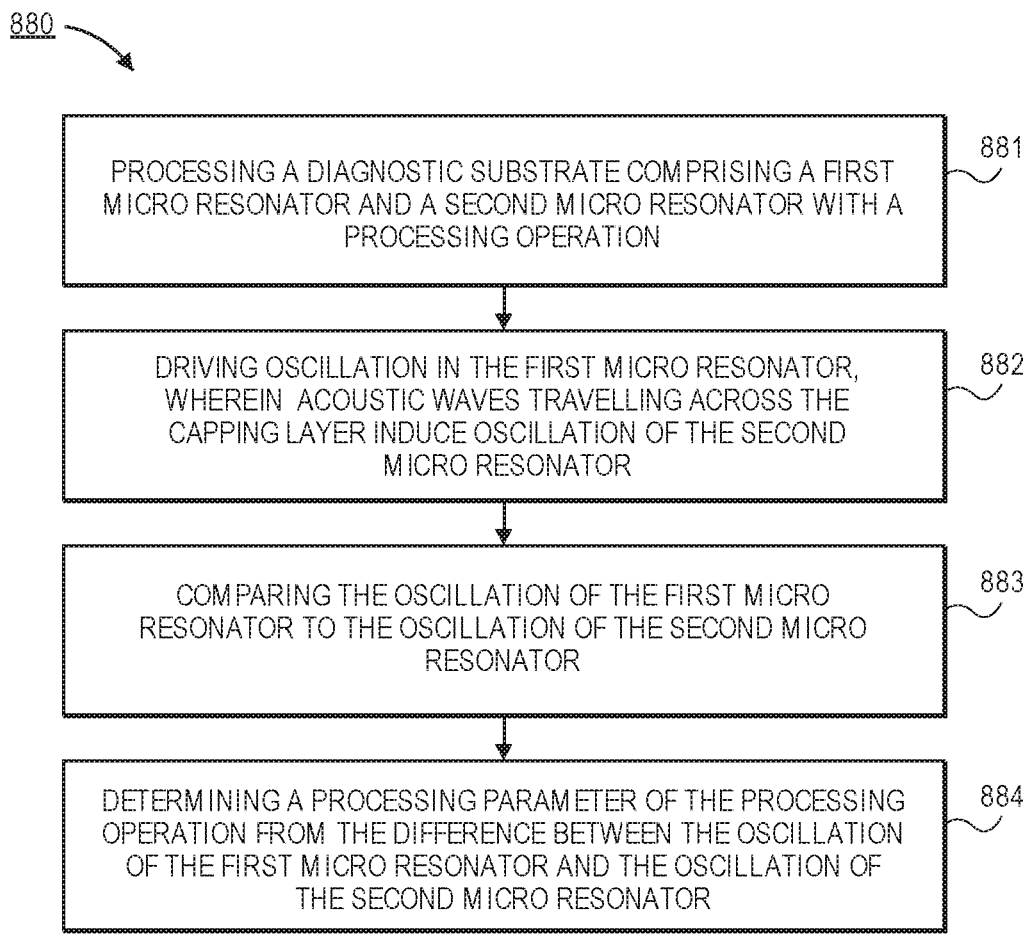
FIG. 8 is a process flow of a process for determining process parameters of a processing operation using coupled micro resonators, in accordance with an embodiment.

Referring now to FIG. 7C, a plan view illustration of a diagnostic substrate 700 with an array of first micro resonators $740_{1-2}$ surrounding a second micro resonator $740_B$ is shown, in accordance with an embodiment. As shown, the array of first micro resonators $740_{1-2}$ may be arranged in rows around the second micro resonator $740_B$. For example, the first row of micro resonators $740_1$ may form a smaller ring around the second micro resonator $740_B$ than a second row of micro resonators $740_2$. In some embodiments, the first row of micro resonators $740_1$ are electrically coupled together with traces 794 and the second row of micro resonators $740_2$ may be electrically coupled together with traces 793. Such a configuration allows each row to operate in unison. In some embodiments, a time delay may be applied to the drive signal applied between the first row of micro resonators $740_1$ relative to the drive signal applied to the second row of micro resonators $740_2$ in order to provide constructive interference between the micro resonators 740 in each row. While two rows are shown, it is to be appreciated that any number of rows may be included in order to provide the desired signal boosting. Referring now to FIG. 8, a process flow illustrating a process 880 for determining a processing parameter from a diagnostic substrate with a first micro resonator and a second micro resonator is shown, in accordance with an embodiment.

In an embodiment, process 880 may begin with operation 881 which includes processing a diagnostic substrate comprising a first micro resonator and a second micro resonator with a processing operation. In an embodiment, the processing operation may comprise an etching process, a deposition process, a polishing process, an implantation process, or any other process that will modify the surface of the diagnostic substrate.

In an embodiment, process 880 may then continue with operation 882 which includes driving oscillation in the first micro resonator. The oscillation of the first micro resonator generates acoustic waves that travel across the capping layer of the diagnostic substrate. The acoustic waves then drive oscillation of the second micro resonator.

In an embodiment, process 880 may then continue with operation 883 which includes comparing the oscillation of the first micro resonator to the oscillation of the second micro resonator. For example, the phase of the oscillations may be compared to each other and/or the magnitude of the oscillations may be compared to each other. In an embodiment, the comparison may be implemented after the first micro resonator and the second micro resonator have reached a steady state. In some embodiments, where a plurality of first micro resonators are used in unison (or with a suitable time delay), the acoustic waves may constructively interfere in order to boost the oscillation signal of the second micro resonator. Accordingly, the precision of the diagnostic substrate may be improved.

In an embodiment, process 880 may then continue with operation 883 which includes determining a processing parameter of the processing operation from the difference between the oscillation of the first micro resonator and the oscillation of the second micro resonator. For example, the difference in the phase of the oscillations may be attributable to a change in impedance in the surface of the diagnostic substrate. Such changes in impedance may be used to calculate the process parameters (e.g., physical changes in the surface of the diagnostic substrate and/or changes in temperature, surface potential, and/or pressure).

In an embodiment, the methods used to determine the processing parameters with diagnostic substrates (e.g., process 560 and process 880) may be implemented in situ. That is, the methods may be implemented in the processing chamber that is used to process the diagnostic substrate. However, it is to be appreciated that the processing parameters may also be determined in other locations (e.g., outside of the processing chamber). For example, processes 560 and/or 880 may be implemented in a load lock or the like. The use of a load lock or other vacuum environments ensures that losses attributable to the atmosphere are minimal. While the load lock provides such a vacuum environment, it is to be appreciated that vacuum environments may also be obtained outside of the processing tool/cluster tool.

Figure 9:
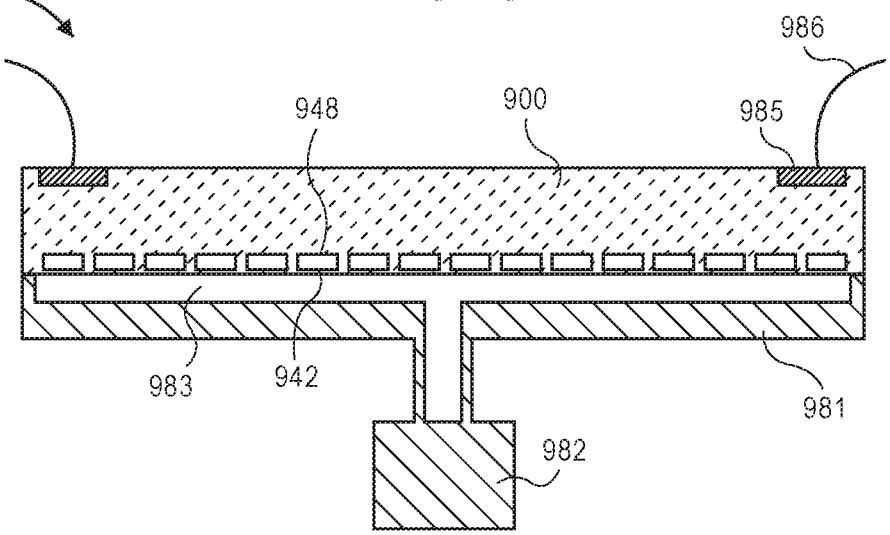
FIG. 9 is a cross-sectional illustration of a mobile vacuum enclosure for implementing diagnostics outside of a processing chamber, in accordance with an embodiment.

For example, FIG. 9 provides a cross-sectional illustration of a mobile testing apparatus 990 that may be used in some embodiments. As shown, the mobile testing apparatus 990 includes an enclosure 981 that forms a vacuum seal over the diagnostic substrate 900. The enclosure 981 may include a pump 982 that forms a vacuum environment over the surface of the diagnostic substrate 900. Accordingly, the diaphragms 942 may be exposed to vacuum on both sides (i.e., the cavity 948 on one side and a vacuum volume 983 on the other side).

Such a configuration may be considered a single sided vacuum since only a single surface (e.g., the bottom surface in FIG. 9) of the diagnostic substrate 900 is exposed to the vacuum environment. Such an embodiment is beneficial since the volume of the vacuum environment is reduced (i.e., the time $t_0$ generate the vacuum is reduced) and a dedicated chamber is not needed since the enclosure seals against the surface of the diagnostic substrate 900. For example, the enclosure 981 may be a vacuum chuck or any other suitable vacuum forming apparatus.

The use of a single sided vacuum testing apparatus 980 also allows for easy access to the backside surface of the diagnostic substrate 900. For example, pads 985 on the backside surface of the diagnostic substrate 900 may be contacted with wires 986, pins, or the like in order to communicatively couple the diagnostic substrate 900 to an external computer, to provide power, or the like.

Figure 10:
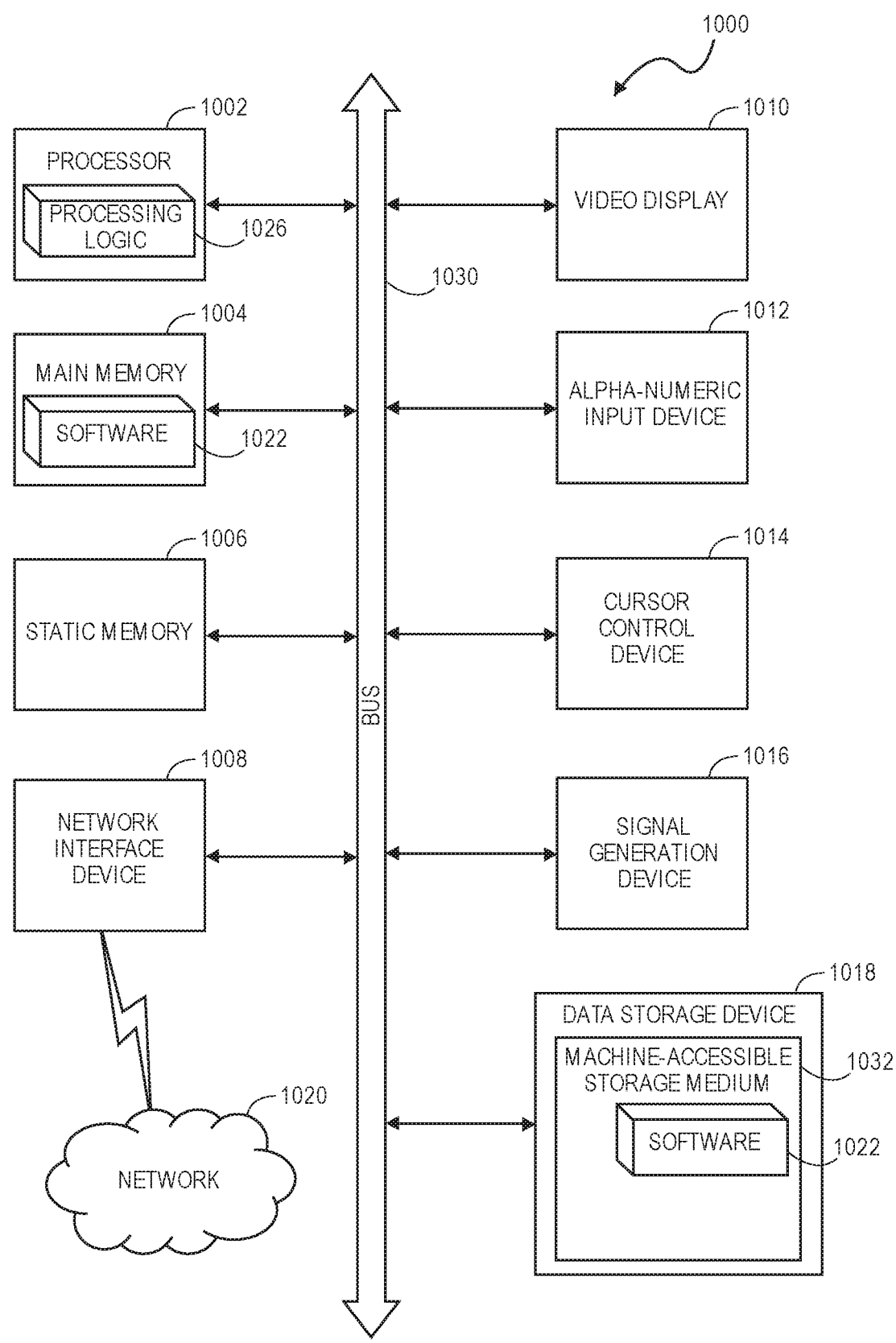
FIG. 10 illustrates a block diagram of an exemplary computer system that may be used in conjunction with processes for determining process parameters of a processing operation, in accordance with an embodiment.

Referring now to FIG. 10, a block diagram of an exemplary computer system 1060 of a processing tool is illustrated in accordance with an embodiment. In an embodiment, computer system 1060 is coupled to and controls processing in the processing tool. Computer system 1060 may be connected (e.g., networked) to other machines in a Local Area Network (LAN), an intranet, an extranet, or the Internet. Computer system 1060 may operate in the capacity of a server or a client machine in a client-server network environment, or as a peer machine in a peer-to-peer (or distributed) network environment. Computer system 1060 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 1060, the term "machine" shall also be taken to include any collection of machines (e.g., computers) that individually or jointly execute a set (or multiple sets) of instructions to perform any one or more of the methodologies described herein.

Computer system 1060 may include a computer program product, or software 1022, having a non-transitory machine-readable medium having stored thereon instructions, which may be used to program computer system 1060 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 1060 includes a system processor 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a secondary memory 1018 (e.g., a data storage device), which communicate with each other via a bus 1030.

System processor 1002 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 1002 may also be one or more special-purpose processing devices such as an application specific integrated circuit (ASIC), a field programmable gate array (FPGA), a digital signal system processor (DSP), network system processor, or the like. System processor 1002 is configured to execute the processing logic 1026 for performing the operations described herein.

The computer system 1060 may further include a system network interface device 1008 for communicating with other devices or machines. The computer system 1060 may also include a video display unit 1010 (e.g., a liquid crystal display (LCD), a light emitting diode display (LED), or a cathode ray tube (CRT)), an alphanumeric input device 1012 (e.g., a keyboard), a cursor control device 1014 (e.g., a mouse), and a signal generation device 1016 (e.g., a speaker).

The secondary memory 1018 may include a machine-accessible storage medium 1031 (or more specifically a computer-readable storage medium) on which is stored one or more sets of instructions (e.g., software 1022) embodying any one or more of the methodologies or functions described herein. The software 1022 may also reside, completely or at least partially, within the main memory 1004 and/or within the system processor 1002 during execution thereof by the computer system 1060, the main memory 1004 and the system processor 1002 also constituting machine-readable storage media. The software 1022 may further be transmitted or received over a network 1020 via the system network interface device 1008. In an embodiment, the network interface device 1008 may operate using RF coupling, optical coupling, acoustic coupling, or inductive coupling.

While the machine-accessible storage medium 1031 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A diagnostic substrate, comprising:
   a substrate;
   a circuit layer over the substrate;
   a capping layer over the circuit layer; and
   a sensing region across the capping layer, wherein the sensing region comprises:
      an array of first micro resonators; and
      a second micro resonator, wherein the array of first micro resonators surround the second micro resonator.

2. The diagnostic substrate of claim 1, wherein the array of first micro resonators are electrically coupled to a single driving circuitry block configured to drive oscillation of the array of first micro resonators in unison.

3. The diagnostic substrate of claim 2, wherein the second micro resonator is not electrically coupled to the single driving circuitry block.

4. The diagnostic substrate of claim 1, wherein each of the first micro resonators in the array of first micro resonators is equally spaced from the second micro resonator.

5. The diagnostic substrate of claim 1, wherein the plurality of first micro resonators are arranged in a plurality of rows around the second micro resonator.

6. A method for determining a processing parameter of a processing operation, comprising:
   processing a diagnostic substrate comprising a micro resonator with the processing operation;
   driving the micro resonator to a plurality of resonance modes by applying a drive signal to the micro resonator;
   recording a resonant frequency of the micro resonator for each of the resonance modes; and
   determining the processing parameter from the resonant frequencies of the plurality of resonance modes, wherein the processing parameter includes one or more of an etch rate, a deposition rate, and an amount of polishing, and wherein determining the processing parameter comprises:
      determining a moment of inertia of the micro resonator for each resonance mode, and using the plurality of moments of inertia to calculate a critical dimension of the processed diagnostic substrate.

7. The method of claim 6, wherein the plurality of resonance modes includes at least a first mode, a second mode, and a third mode.

8. The method of claim 7, wherein the first mode is substantially parallel to a direction of a plurality of trenches over the micro resonator and the second mode is substantially perpendicular to the plurality of trenches.

9. The method of claim 6, wherein the resonant frequency of each of the resonance modes is recorded more than once during the processing of the diagnostic substrate.

10. The method of claim 6, The method of claim 1, wherein the micro resonator is one of a plurality of micro resonators in an array across the diagnostic substrate.

11. The method of claim 10, wherein an average of the resonant frequencies of each resonance mode of the plurality of the micro resonators is used to determine the processing parameter.

12. The method of claim 6, wherein determining the processing parameter from the resonant frequencies of the plurality of resonance modes comprises calculating a differential between the resonant frequencies of a first micro resonator and the resonant frequencies of a second micro resonator.

13. The method of claim 6, further comprising:
    resurfacing the micro resonator after determining the processing parameter.

14. The method of claim 6, wherein the micro resonator is driven to a plurality of resonance modes in-situ in a chamber, in a load lock, in a mobile testing apparatus, or in a non-vacuum environment.

15. A method of determining a processing parameter of a processing operation, comprising:
    processing a diagnostic substrate comprising a first micro resonator and a second micro resonator with the processing operation;
    driving oscillation in the first micro resonator, wherein acoustic waves traveling across a surface of the diagnostic substrate induce oscillation of the second micro resonator;
    comparing the oscillation of the first micro resonator to the oscillation of the second micro resonator; and
    determining the processing parameter of the processing operation from the difference between the oscillation of the first micro resonator and oscillation of the second micro resonator, and wherein the processing parameter includes one or more of an etch rate, a deposition rate, and an amount of polishing.

16. The method of claim 15, wherein comparing the oscillation of the first micro resonator to the oscillation of the second micro resonator comprises comparing an amplitude of the oscillation of the first micro resonator to an amplitude of the oscillation of the second micro resonator.

17. The method of claim 15, wherein comparing the oscillation of the first micro resonator to the oscillation of the second micro resonator comprises comparing a phase of the oscillation of the first micro resonator to a phase of the oscillation of the second micro resonator.

18. The method of claim 15, wherein comparing the oscillation of the first micro resonator to the oscillation of the second micro resonator is implemented after the first micro resonator and the second micro resonator have reached a steady state.

19. The method of claim 15, wherein the first micro resonator is one of an array of first micro resonators, and wherein the array of first micro resonators surround the second micro resonator, and wherein the acoustic waves from the first micro resonators constructively interact to amplify the oscillation of the second micro resonator.

* * * * *